United States Patent
Schwarz

(10) Patent No.: US 10,148,149 B2
(45) Date of Patent: Dec. 4, 2018

(54) EXPLOSION-PROTECTED HOUSING

(71) Applicant: Eaton Protection Systems IP GmbH & Co. KG, Schönefeld (DE)

(72) Inventor: Gerhard Schwarz, Schonbrunn (DE)

(73) Assignee: EATON PROTECTION SYSTEMS IP GMBH & CO. KG, Schonefeld (DE)

( * ) Notice: Subject to any disclaimer, the term of this patent is extended or adjusted under 35 U.S.C. 154(b) by 88 days.

(21) Appl. No.: 14/650,255

(22) PCT Filed: Dec. 2, 2013

(86) PCT No.: PCT/EP2013/003632
§ 371 (c)(1),
(2) Date: Jun. 5, 2015

(87) PCT Pub. No.: WO2014/086475
PCT Pub. Date: Jun. 12, 2014

(65) Prior Publication Data
US 2015/0326091 A1    Nov. 12, 2015

(30) Foreign Application Priority Data
Dec. 7, 2012 (DE) .................. 10 2012 023 979

(51) Int. Cl.
*F24D 19/02* (2006.01)
*F24D 5/10* (2006.01)
(Continued)

(52) U.S. Cl.
CPC ......... *H02K 5/136* (2013.01); *H05K 7/20254* (2013.01)

(58) Field of Classification Search
CPC ........... A62C 3/16; A62C 35/02; A62C 37/00; A62C 3/002; A62C 31/02; F28F 1/045;
(Continued)

(56) References Cited

U.S. PATENT DOCUMENTS

| 4,691,783 A * | 9/1987 | Stern ................ G08B 17/00 169/19 |
| 6,392,322 B1 * | 5/2002 | Mares ................ B23Q 5/58 310/12.04 |

(Continued)

FOREIGN PATENT DOCUMENTS

| JP | H02-148891 | 6/1990 |
| JP | H03-096091 | 10/1991 |

OTHER PUBLICATIONS

Benfield, Alan, International Search Report of International Application No. PCT/EP2013/003632, date completed Feb. 19, 2014, dated Feb. 25, 2014, 4 pages, European Patent Office.
(Continued)

*Primary Examiner* — Davis Hwu
(74) *Attorney, Agent, or Firm* — King & Spalding LLP

(57) ABSTRACT

An explosion-protected housing, such as a switchboard, junction box, distribution box, or the like, comprising sidewalls, one back or bottom wall connecting the sidewalls, and a lid or door wall part closing a housing opening. In the housing interior, electronic and/or electric components are arranged, wherein the housing comprises a cooling device. To allow the cooling of a plurality of electronic and/or electric components in the housing interior in a simple way and without higher costs and requiring more space, at least one cooling pipe as a cooling device is provided in at least one wall or a wall part and is closed to the housing interior and flowed through by a cooling fluid.

12 Claims, 2 Drawing Sheets

(51) Int. Cl.
  *H02K 5/136* (2006.01)
  *H05K 7/20* (2006.01)
(58) Field of Classification Search
  CPC . H02K 5/136; H05K 7/20336; H05K 7/20254
  USPC .......................... 169/16, 17, 54, 66; 165/53
  See application file for complete search history.

(56) References Cited

U.S. PATENT DOCUMENTS

| | | | |
|---|---|---|---|
| 6,637,518 B1* | 10/2003 | Hillier | A62C 99/0072 169/16 |
| 6,763,894 B2* | 7/2004 | Schoenrock | A62C 31/02 169/11 |
| 8,602,119 B2* | 12/2013 | Wagner | A62C 3/004 169/11 |
| 2003/0161104 A1* | 8/2003 | Hartzell | F28F 1/045 361/699 |
| 2004/0085733 A1* | 5/2004 | Leon | H05K 7/20336 361/700 |
| 2007/0041160 A1 | 2/2007 | Kehret et al. | |
| 2007/0285889 A1 | 12/2007 | Watson et al. | |
| 2010/0288467 A1 | 11/2010 | Manahan et al. | |
| 2011/0304297 A1* | 12/2011 | Sohn | H01M 10/46 320/107 |

OTHER PUBLICATIONS

Seki, Nobuyuki, Japanese Office Action issued in Japanese Patent Application No. 2015-545690, dated Apr. 26, 2016, 3 pages, translation of office action 5 pages.

* cited by examiner

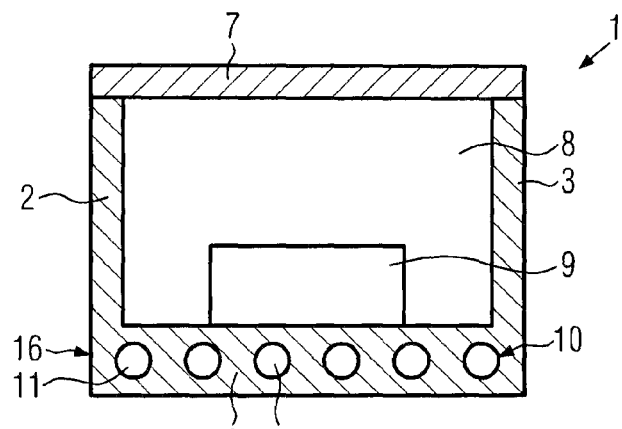
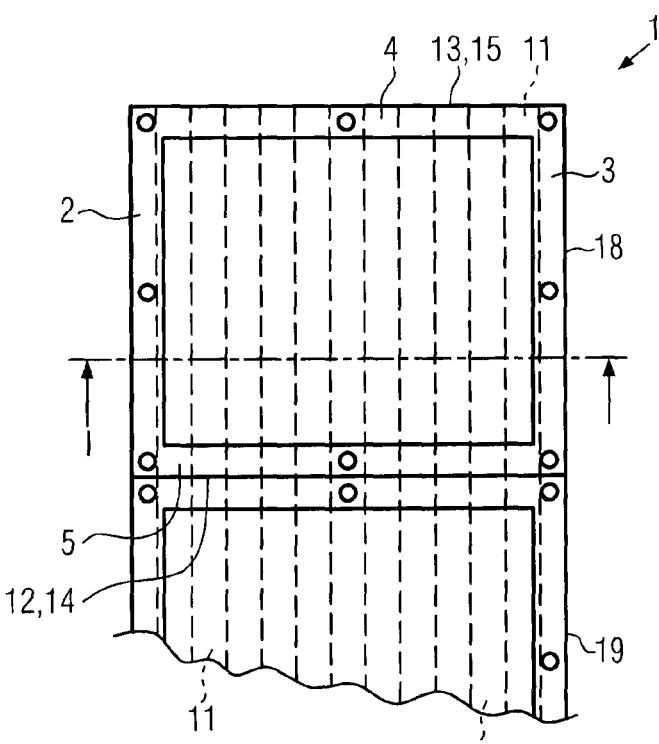

EXPLOSION-PROTECTED HOUSING

PRIORITY CLAIM

The present application is a national phase of and claims priority to International Application No. PCT/EP2013/003632 with an International filing date of Dec. 2, 2013 and which claims priority to German patent application no. 102012023979.3 filed Dec. 7, 2012. The foregoing applications are hereby incorporated herein by reference.

TECHNICAL FIELD

The invention pertains to an explosion-protected housing, such as a switchboard, junction box, distribution box, or the like.

BACKGROUND

As a rule, such a housing comprises four sidewalls, a back or a bottom wall connecting the sidewalls, and a lid or door wall part closing a housing opening. The lid wall part can, for example, be fixedly connected to the other parts of the housing by screws or the like. A door wall part is generally pivotably connected to the other parts of the housing, and might be connected to the housing in its closing position, such that the housing is explosion-protected.

In the interior of the housing, electronic and/or electric components are arranged, which generally produce heat during operation. For removal of such heat, the housing comprises a cooling means.

Depending on the produced heat and the size of the housing, it might be sufficient, when such cooling means only comprises particular cooling openings. Those might, for example, be formed by narrow gaps of the explosion-protected housing. Such narrow gaps are flame-proofed, but are sufficient for cooling only in case there is relatively low waste heat and if there are only a few corresponding electronic and electric components.

However, in case high power components are used, such cooling means may no longer be sufficient, such that the housing has to use additional cooling means, such as cooling fins or the like.

There is also the possibility for forming the housing in comparison to the components arranged in the housing interior with a comparable large size, such that sufficient cooling is possible according to the size of the housing.

However, this means an increase of costs and also an increase in the space required, which is generally necessary for the arrangement of the corresponding electric and electronic components.

Also the usage of corresponding cooling fins, which are generally arranged on the outside of the housing, results in an increased amount of space.

It is further possible to cool the housing interior actively by a corresponding supply of cooling fluid. Such a cooling generally takes place from the outside of the housing and again the corresponding devices and embodiments of a cooling means are necessary, which also have to fulfill the corresponding requirements concerning the explosion protection.

It is an object of the present invention to improve a corresponding explosion-protected housing, as described above, such that in a simple way and without increased costs and increased need of space, a cooling also of a plurality of electronic and/or electric components is possible in the housing interior.

SUMMARY

This object is solved by the features of claim 1.

According to the invention, at least one wall or wall part comprises a cooling pipe, which is closed relative to the housing interior, and which is used to flow through a cooling fluid. This means that the cooling pipe is not in connection with the housing interior, but is a closed cooling pipe with respect to the housing interior and is arranged in one or more walls or wall parts of the housing.

This results in improved cooling compared to a narrow gap, as explained above, or by cooling means, which has to fulfill the particular requirements for explosion protection.

If required, it is possible that several cooling pipes are provided. In a simple arrangement of such plurality of cooling pipes, they may be arranged parallel to each other in the corresponding wall or the corresponding wall part.

To allow a corresponding cooling fluid to flow through such cooling pipes, such a cooling pipe may have pipe openings at corresponding pipe ends that are open to the exterior of the housing. It is possible that just air flows through the cooling pipe or cooling pipes in the corresponding wall or corresponding wall part from the exterior and will result in a sufficient cooling of the housing interior.

Aside from the parallel arrangement of the number of cooling pipes, it is also possible that the cooling pipe is linear, spirally shaped, U-shaped, meandering, or also runs in another way in the wall, respectively wall part. Also with such a running of the cooling pipe, the arrangement of a number of cooling pipes is possible. Depending on the thickness of the corresponding wall or wall part, it is also feasible that cooling pipes are arranged in different levels.

In case of a simple embodiment, it might be considered advantageous if the cooling pipe or the cooling pipes run in one level or plane. This plane or level is for example parallel to the side surfaces of the corresponding wall or the corresponding wall part.

The cooling pipes may be simplified by a simple cross section, such as an essentially circular cross-section. To render possible an increased cooling by the cooling pipe or cooling pipes, this may be connected with a fluid moving device. Such a device allows an increased moving of the fluid along the cooling pipes, such that a higher throughput of the corresponding fluid for cooling is possible.

In case such a fluid is, for example, air, the fluid-moving device may be a ventilation device. Such a ventilation device may be assigned to each cooling pipe or also to a number of cooling pipes, simultaneously.

In case the fluid is water, such a fluid-moving device may be a water pump. Such a pump may also be assigned to each cooling pipe or to a number of cooling pipes, simultaneously. A corresponding flowing of the fluid through the cooling pipes may be performed one after the other of the number of cooling pipes (serially) or may also be performed (parallel) through each of the cooling pipes simultaneously. This depends on the arrangement of the corresponding fluid-moving device relative to the cooling pipe or the cooling pipes.

It is also feasible that the cooling pipes are arranged in more than one wall or one wall part.

In the case of explosion-protected housings, it is known from practice that such a housing is assembled from housing modules. In this connection, it might be advantageous, in case the corresponding cooling pipes are provided in each housing module.

To use only one fluid moving device for such housing modules, it is also possible that the cooling pipes of the housing modules may be connected to each other.

BRIEF DESCRIPTION OF THE DRAWINGS

In the following, advantageous embodiments will be described by the accompanying drawings.

FIG. 1 shows a section along line I-I of an explosion-protected housing according to FIG. 2;

FIG. 2 shows a plane view of an explosion-protected housing;

DETAILED DESCRIPTION OF EXAMPLE EMBODIMENTS

Figure 3:
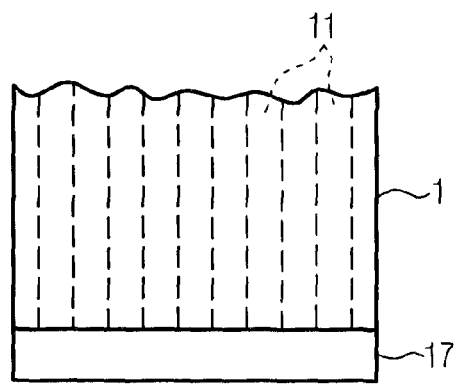
FIG. 3 shows an explosion-protected housing analogous to FIG. 2 with a fluid moving device.

FIG. 1 shows a sectional view along line I-I according to FIG. 2 through housing 1 according to the present invention.

The housing is an explosion-protected housing and maybe a switchboard, distribution box, junction box, or the like. In the interior 8 of the housing, electronic and/or electric components 9 are arranged, which produce waste heat during the corresponding operation. A cooling device 10 is provided for cooling the interior 8 of the housing and in particular the electric or electronic components 9. Such a cooling device 10 comprises according to the embodiment in FIG. 1 a number of cooling pipes 11, which are provided in a bottom wall 6 of housing 1. The housing 1 further comprises four lateral walls 2, 3, 4 and 5, as shown in FIG. 2, which are connected to the bottom wall 6 and which surround a housing opening at an upper end of the housing. This housing opening can be closed by a lid or door wall part 7. The lid/door wall part 7 is generally screwed to the upper ends of the sidewalls or is fixed there in another releasable way to provide the corresponding explosion protection of the housing.

The bottom wall 6 can also be a back wall of the housing in case this is arranged in another kind of placement. The bottom wall generally has a higher thickness when compared to the sidewalls. The corresponding cooling pipes 11 are closed relative to the housing interior 8 and extend for example from one end of the wall to the other end of the wall within the bottom wall 6, as shown in FIG. 2.

The cooling pipes are opened to the housing exterior in the illustrated embodiment and comprise pipe openings 14 and 15, as shown in FIGS. 1 and 2, at the corresponding ends 12 and 13.

The corresponding cooling pipes 11 may be arranged in the same distance and parallel to each other within the bottom wall 6. It is also possible that additionally or alternatively with respect to the arrangement of the cooling pipes 11 according to FIGS. 1 and 2, the corresponding cooling pipes are also arranged in one or more of the sidewalls 2, 3, 4 and 5 or in the lid/door wall part 7.

Moreover, it is also possible that, for example, a cooling pipe of the bottom wall 6 extends in one of the sidewalls. It is emphasized that according to FIGS. 1 and 2, the corresponding cooling pipes 11 are only illustrated as an example and that other runnings and arrangements of cooling pipes are possible. For example, it is also possible that a cooling pipe, which runs in a spiral form and is arranged in the corresponding bottom wall 6 or in one sidewall 2, 3, 4 or 5. Further runnings of the cooling pipes are, for example, U-shape, meandering or also in another way. It is further possible that the cooling pipes are not only arranged in one plane or level, as illustrated by plane 16 of FIG. 1, but also in different levels. The cooling pipes of different levels may be arranged one on top of the other and/or displaced with respect to each other.

All of the cooling pipes 11 form the corresponding cooling device 10, such that no further cooling of the housing interior 8 by, for example, narrow gaps or by a cooling device guided into the housing interior 8 is necessary.

In FIG. 2, a corresponding housing 1 according to the invention is illustrated in plane view, wherein in this case, the housing 1 is assembled module-like by at least two housing modules 18 and 19. According to such module-like assembly, it is in particular possible that cooling pipes 11 of one housing module 18 are connected to cooling pipes in the other housing module 19. Of course, it is also possible that the cooling pipes of each housing module are directly open to the exterior of the housing and are not connected with the corresponding ends or pipe openings of the cooling pipes of other housing modules.

As a rule, simple cooling pipes have the advantage that those, for example, have essentially circular cross-sections. However, also other cross-sections are possible, such as multi-lateral cross-sections, oval cross-sections, or the like.

The cooling fluid flows through the corresponding cooling pipes 11 of the cooling device 10. In a simple case, such a cooling fluid is air, which enters through the corresponding pipe openings at the ends of the cooling pipes and which exits at other pipe openings at the other ends of the cooling pipes.

Figure 4:
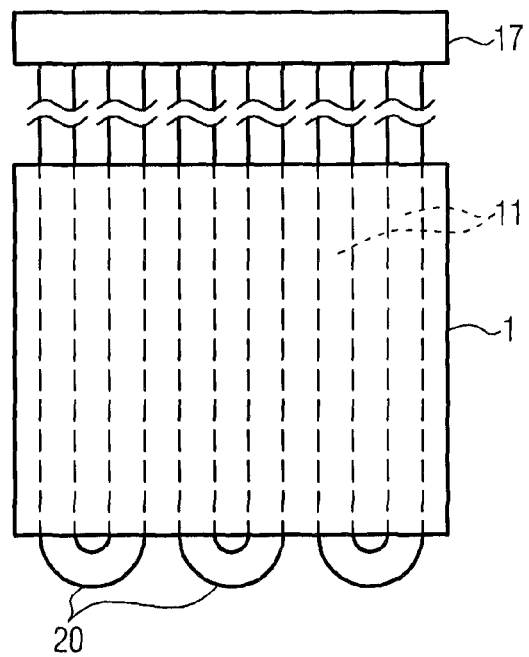
FIG. 4 shows a housing according to FIG. 3 with a further embodiment of cooling pipes and a fluid-moving device.

In FIGS. 3 and 4, the further embodiments of housing 1 with cooling device 10 according to the invention are illustrated, wherein in those cases, there is a forced guidance of the cooling fluid through the cooling pipes.

In the embodiment according to FIG. 3 and with air as a fluid, it is for example possible to assign to each end of the corresponding cooling pipes 11 a fluid movement device 17 in the form of a ventilation device. By this air is injected into the corresponding cooling pipes 11, such that a higher throughput of cooling fluid, compared to the embodiment in FIGS. 1 and 2, is provided.

In this connection, it is also possible that the ventilation device 17 is assigned simultaneously to all the corresponding ends of cooling pipes 11. It is further possible that a separate ventilation device is assigned to each end of a cooling pipe also on opposite sides of the corresponding walls or wall parts.

According to the embodiment in FIG. 4, the cooling pipes 11 of cooling device 10 are connected to a water pump or the like, as an example of a fluid-moving device. In such a case, water as a fluid is pumped through the cooling pipes. The corresponding cooling pipes are U-shaped, wherein a U-connector 20 is arranged at an end of such a cooling pipe. Such a connector is used for diverting the cooling pipe back to the corresponding fluid moving device 17.

Again, it is possible that a corresponding fluid moving device is assigned to each cooling pipe or is assigned to all cooling pipes together, such that, for example, the fluid flows either through all the cooling pipes are after the other in a serial manner or parallel and simultaneously through each of the cooling pipes.

The two embodiments according to FIGS. 3 and 4 further allows the possibility that the corresponding fluid is also cooled in the region of the fluid moving device. A corresponding cooling means is not illustrated in FIGS. 3 and 4 for the sake of simplicity.

The invention claimed is:

1. An explosion-protected housing comprising:
   sidewalls,
   a back or bottom wall connecting the sidewalls,
      wherein the sidewalls and the back or bottom wall define a housing interior cavity and a housing opening, and
      wherein the housing interior cavity is configured to house electronic and/or electric components therein,
   a lid or door wall part closing the housing opening and enclosing the housing interior cavity, wherein the lid or door wall part is releasably coupled to an upper end of at least one of the sidewalls such that the housing is explosion protected by narrow gaps formed therein that are flame proof while being able to allow gases released from an explosion to pass through, thereby containing the explosion; and
   a cooling device comprising at least one cooling pipe, wherein the at least one cooling pipe is disposed inside at least one of the sidewalls, the back or bottom wall, and the lid or door wall part such that the at least one cooling pipe is closed relative to the housing interior cavity and a cooling fluid flows through the at least one cooling pipe without entering the housing interior cavity.

2. The explosion-protected housing according to claim 1, wherein the at least one cooling pipe comprises a number of cooling pipes that are arranged parallel to each other in the sidewalls, the back or bottom wall, or the lid or door wall part.

3. The explosion-protected housing according to claim 1, wherein the at least one cooling pipe comprises pipe openings at pipe ends, which are open to the exterior of the housing.

4. The explosion-protected housing according to claim 1, wherein the at least one cooling pipe runs in the sidewalls, the back or bottom wall, or the lid or door wall part linearly, spirally, U-shaped, or meandering.

5. The explosion-protected housing according to claim 1, wherein the at least one cooling pipe runs in one plane.

6. The explosion-protected housing according to claim 1, wherein the at least one cooling pipe comprises an essentially circular cross-section.

7. The explosion-protected housing according to claim 1, wherein the at least one cooling pipe is connected to a fluid-moving device.

8. The explosion-protected housing according to claim 1, wherein the cooling fluid is air.

9. The explosion-protected housing according to claim 1, wherein the cooling fluid is water.

10. The explosion-protected housing according to claim 1, wherein the at least one cooling pipe extends through more than one of the sidewalls, the back or bottom wall, and the lid or door wall part.

11. The explosion-protected housing according to claim 1, wherein the housing is assembled from housing modules, wherein the at least one cooling pipe is formed in each housing module.

12. The explosion-protected housing according to claim 11, wherein the housing modules are connected to each other by connecting the at least one cooling pipe formed in each housing module.

* * * * *